United States Patent
Chetcuti et al.

(12)

(10) Patent No.: US 6,767,403 B1
(45) Date of Patent: Jul. 27, 2004

(54) SPIN BOWL HAVING FLUID SEAL FOR PREVENTING AIR FROM FLOWING INTO THE BOWL DURING SPINNING

(75) Inventors: Fred J. Chetcuti, Millbrae, CA (US); Henner Meinhold, San Jose, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 09/713,846

(22) Filed: Nov. 15, 2000

(51) Int. Cl.[7] .............................................. B05C 11/02
(52) U.S. Cl. ........................ 118/52; 118/56; 118/501; 118/500; 118/504
(58) Field of Search ............................. 118/50, 52, 56, 118/319, 320, 500, 501, 504; 427/240, 425

(56) References Cited

U.S. PATENT DOCUMENTS 5,863,328 A * 1/1999 Sichmann et al. .......... 118/500
5,985,031 A * 11/1999 Davis ......................... 118/500
6,220,771 B1 * 4/2001 Tung et al. ................... 118/52

* cited by examiner

*Primary Examiner*—Richard Crispino
*Assistant Examiner*—George R. Koch, III

(57) ABSTRACT

A spin bowl includes a base and a sidewall that extends from the base. The base has an upper portion for supporting a substrate in a horizontal plane and a lower portion that intersects with the sidewall. The lower portion of the base has a plurality of drain holes formed therein proximate to the sidewall. Each of the plurality of drain holes is configured to trap fluid therein during spinning of the spin bowl to thereby form a fluid seal that prevents air from flowing therethrough. In one embodiment, each of the drain holes is V-shaped. In another embodiment, the fluid seal is formed by the intersection of a straight drain hole with an external fluid catch area. An apparatus and method for spin coating a film over a substrate also are described.

14 Claims, 7 Drawing Sheets

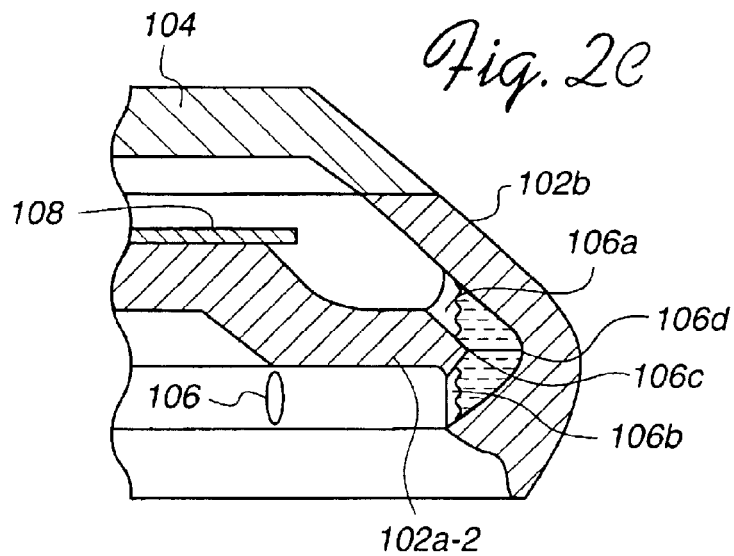
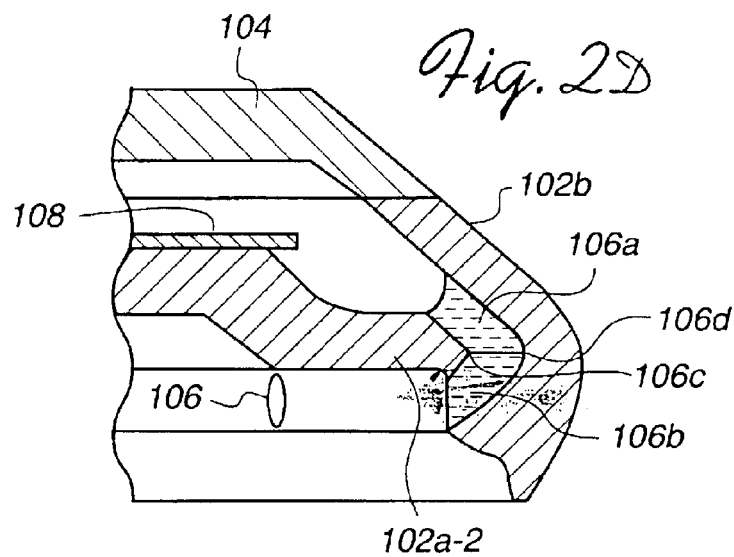
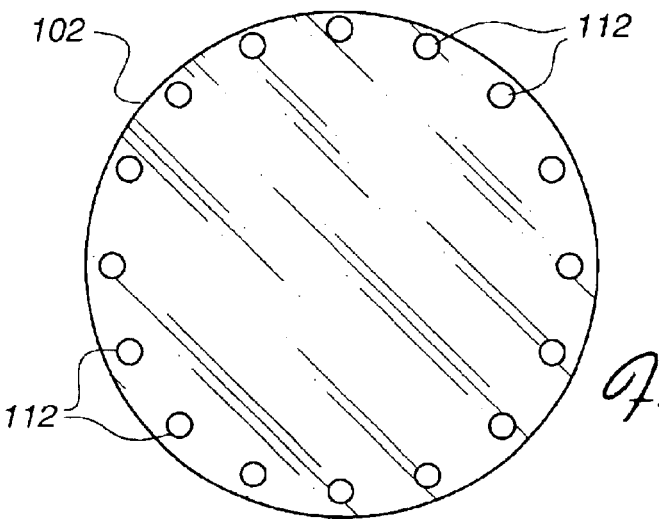

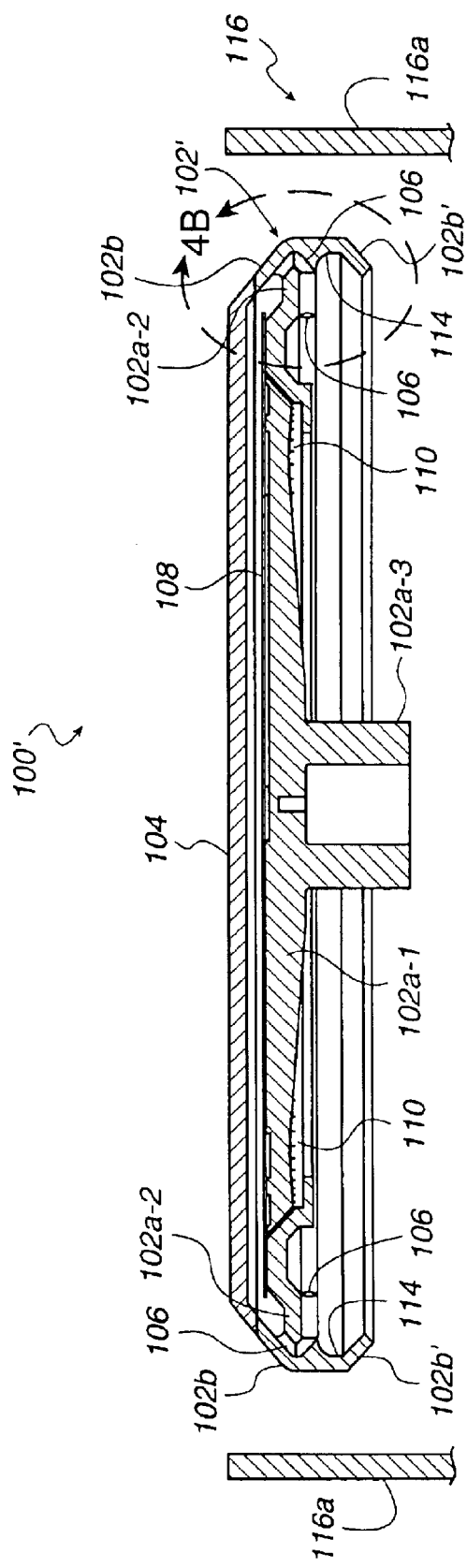

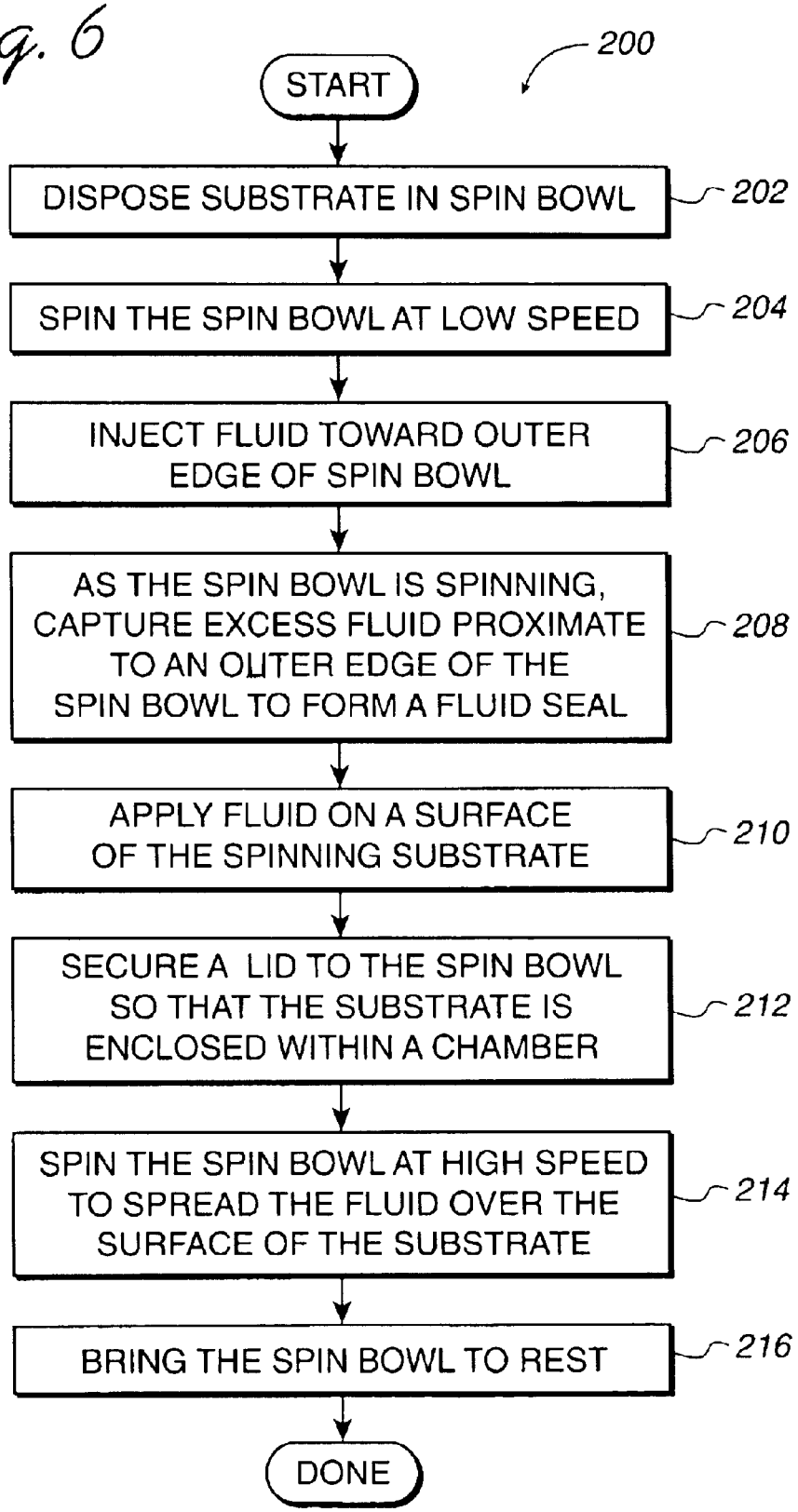

SPIN BOWL HAVING FLUID SEAL FOR PREVENTING AIR FROM FLOWING INTO THE BOWL DURING SPINNING

BACKGROUND OF THE INVENTION

The present invention relates generally to spin coating and, more particularly, to a fluid-sealed spin bowl, a spin bowl having an external fluid catch area, an apparatus for spin coating a film over a substrate, and a method for spin coating a film over a substrate.

Spin coating is used to form films over substrates in the fabrication of a variety of devices. For example, in the fabrication of semiconductor devices, films of photoresist materials and low dielectric constant materials (sometimes referred to as "low k materials") are spin coated over the surface of semiconductor wafers. In a typical spin coating operation in which a photoresist coating is applied over the surface of a wafer, photoresist fluid is applied on the surface of the wafer and the wafer is spun at high speeds in a spin bowl. The centrifugal force caused by the rotation of the wafer causes the photoresist fluid to spread over the surface of the wafer and form a film. Excess photoresist fluid that spins off the surface of the wafer drains from the spin bowl through drain holes formed therein and is collected in a stationary drain bowl disposed below the spin bowl.

One problem with conventional spin bowls is that air flows into the bowl through the drain holes as the bowl is spinning. This airflow is caused by the difference between the speed of the air inside the spin bowl and the speed of the air outside of the bowl during spinning. The differing air speeds create a differential pressure that causes air to flow into the spin bowl through the drain holes. Such back flow of air into the spin bowl is undesirable because it adversely affects the characteristics of the film being spin coated on the wafer. For instance, the back flow of air may cause streaks to form on the film or may cause the film to have a nonuniform thickness. Further, the back flow of air may cause premature drying of the film.

In one known spin bowl, the drain holes are straight and extend downwardly away from the wafer. During spinning, these drain holes remain open and allow air to flow back into the spin bowl, and the back flow of air that reaches the film causes the adverse effects described above. In another known spin bowl, a baffle is provided in an effort to minimize the adverse effects of the back flow of air that reaches the film. In this spin bowl, the excess fluid that spins off the surface of the wafer remains inside the bowl during spinning and drains from the bowl when the bowl comes to rest. This approach suffers from two primary drawbacks. First, because the fluid remains in the bowl during spinning, the amount of fluid that can be dispensed before the bowl has to be stopped to drain the fluid therefrom is limited. Second, the fluid captured in the spin bowl can splash onto the wafer during deceleration of the bowl.

In view of the foregoing, there is a need for a spin bowl that prevents air from flowing into the bowl during spinning, but still allows excess fluid to drain from the bowl during spinning.

SUMMARY OF THE INVENTION

Broadly speaking, the present invention fills this need by providing a spin bowl that has drain holes configured to trap fluid therein and thereby form a fluid seal that prevents air from flowing into the bowl through the drain holes. An apparatus and method for spin coating a film over a substrate also are described.

In accordance with one aspect of the present invention, a spin bowl is provided. The spin bowl includes a base and a sidewall that extends from the base. The base has an upper portion for supporting a substrate in a horizontal plane and a lower portion that intersects with the sidewall. The lower portion of the base has a plurality of drain holes formed therein proximate to the sidewall. Each of the plurality of drain holes is configured to trap fluid therein during spinning of the spin bowl to thereby form a fluid seal that prevents air from flowing therethrough.

In one embodiment, each of the plurality of drain holes is substantially V-shaped. In another embodiment, the sidewall is configured to define a fluid catch area, and each of the plurality of drain holes is in fluid communication with the fluid catch area. The fluid seal is formed when excess fluid accumulates in the fluid catch area to the point that that the excess fluid blocks either the inlet or the outlet of each drain hole. In this embodiment, each of the drain holes may be oriented so that the inlet is closer to a center of the spin bowl than the outlet. Each of the drain holes is preferably oriented at an angle in a range from about 30 degrees to about 60 degrees relative to the horizontal plane defined by the upper portion of the base. In one preferred embodiment, each of the drain holes is oriented at an angle of about 45 degrees relative to the horizontal plane defined by the upper portion of the base.

In accordance with another aspect of the present invention, an apparatus for spin coating a film over a substrate is provided. The spin coating apparatus includes a rotatable spin bowl and a lid secured thereto so as to define a closed chamber. The rotatable spin bowl includes a plurality of drain holes that are configured to trap fluid therein during spinning of the bowl to thereby form a fluid seal that prevents air from flowing into the bowl through the drain holes in accordance with the present invention. The lid is configured to mate with the sidewall of the rotatable spin bowl so that an underside of the lid is in close proximity to the top surface of the substrate supported on the upper portion of the base.

In accordance with yet another aspect of the present invention, a method for spin coating a film over a substrate is provided. In this method, a substrate is disposed in a spin bowl. The spin bowl is then spun at a relatively low speed. Next, a first fluid is injected into the spin bowl. As the spin bowl is spinning, excess fluid is captured proximate to an outer edge of the spin bowl to form a fluid seal that prevents air from flowing into the spin bowl through drain holes formed in the bowl. Once the fluid seal is formed, a second fluid is applied on the surface of the spinning substrate. The spin bowl is then spun at a relatively high speed to spread the second fluid over the surface of the substrate and form a film. Once the film is formed over the substrate, the spin bowl is brought to rest. After the operation of applying the fluid on the surface of the spinning substrate, the method also may include securing a lid to the spin bowl so that the substrate is enclosed within a closed chamber.

In one embodiment, the first fluid is comprised of a solvent. In one embodiment, the first fluid is injected toward an outer edge of the spin bowl through a backside rinse channel. In one embodiment, the second fluid is selected from the group consisting of a photoresist material, a low k dielectric material, a spin-on-glass, and a dye chemical used in the fabrication of recordable compact discs.

In one embodiment, the excess fluid is captured in substantially V-shaped drain holes. In another embodiment, the excess fluid is captured in a fluid catch area at least partially defined by a sidewall of the spin bowl, and each of the drain holes formed in the bowl is in fluid communication with the fluid catch area. In this latter embodiment, the fluid seal is formed when excess fluid accumulates in the fluid catch area to the point that that the excess fluid blocks either the inlet or the outlet of each drain hole.

In accordance with a still further aspect of the present invention, a spin bowl having an external fluid catch area is provided. This spin bowl includes a base and a sidewall that extends from the base. The base has an upper portion for supporting a substrate in a horizontal plane and a lower portion that intersects with the sidewall. The lower portion of the base has a plurality of drain holes formed therein proximate to the sidewall. The sidewall has an upper portion that extends upwardly from the base and a lower portion that extends downwardly from the base so as to define an external fluid catch area that receives excess fluid that drains from an interior of the spin bowl through the drain holes. The external fluid catch area is configured to retain the excess fluid while the spin bowl is spinning and thereby prevent the excess fluid leaving the bowl at high velocity. In one embodiment, the lower portion of the sidewall is inclined inwardly so that a tip thereof is situated closer to a center of the spin bowl than a point at which the lower portion of the sidewall intersects with the upper portion of the sidewall.

The fluid-sealed spin bowl of the present invention provides a number of significant advantages relative to conventional spin bowls. These advantages include the elimination of streaks caused by the back flow of air into the bowl, improved coat uniformity at all thicknesses, and greater process latitude in the formation of spun films. The primary reason that the fluid-sealed spin bowl affords greater process latitude is that the film can be spun for a longer period of time without drying because of the completely enclosed and sealed environment within the bowl. In the embodiments of the invention in which the excess fluid is trapped in an external fluid catch area, the fluid-sealed spin bowl of the present invention is further advantageous because the use of an external fluid catch area prevents the trapped fluid from splashing onto the wafer, and because its one-piece construction avoids the need for an extra baffle piece as found in one known design. An additional advantage of the external fluid catch area is that it prevents the fluid that drains from the spin bowl during spinning from leaving the bowl and contacting the sidewall of a stationary drain bowl at high velocity. This reduces splashing and atomization of the fluid outside the bowl.

It is to be understood that the foregoing general description and the following detailed description are exemplary and explanatory only and are not restrictive of the invention, as claimed.

BRIEF DESCRIPTION OF THE DRAWINGS

The accompanying drawings, which are incorporated in and constitute part of this specification, illustrate exemplary embodiments of the invention and together with the description serve to explain the principles of the invention.

FIGS. 2B–2D illustrate the manner in which excess fluid drains from the spin bowl shown in FIGS. 1 and 2A through the V-shaped drain holes formed therein and forms a fluid seal that prevents air from flowing into the spin bowl through such drain holes.

FIG. 3 is a simplified schematic diagram that illustrates exemplary drain hole locations in accordance with one embodiment of the invention.

FIG. 4A is a cross-sectional view of an apparatus for spin coating a film over a substrate in accordance with another embodiment of the present invention.

FIG. 6 is a flowchart diagram illustrating the method operations performed in spin coating a film over a substrate in accordance with one embodiment of the invention.

DETAILED DESCRIPTION OF THE INVENTION

Several exemplary embodiments of the invention will now be described in detail with reference to the accompanying drawings.

Figure 1:
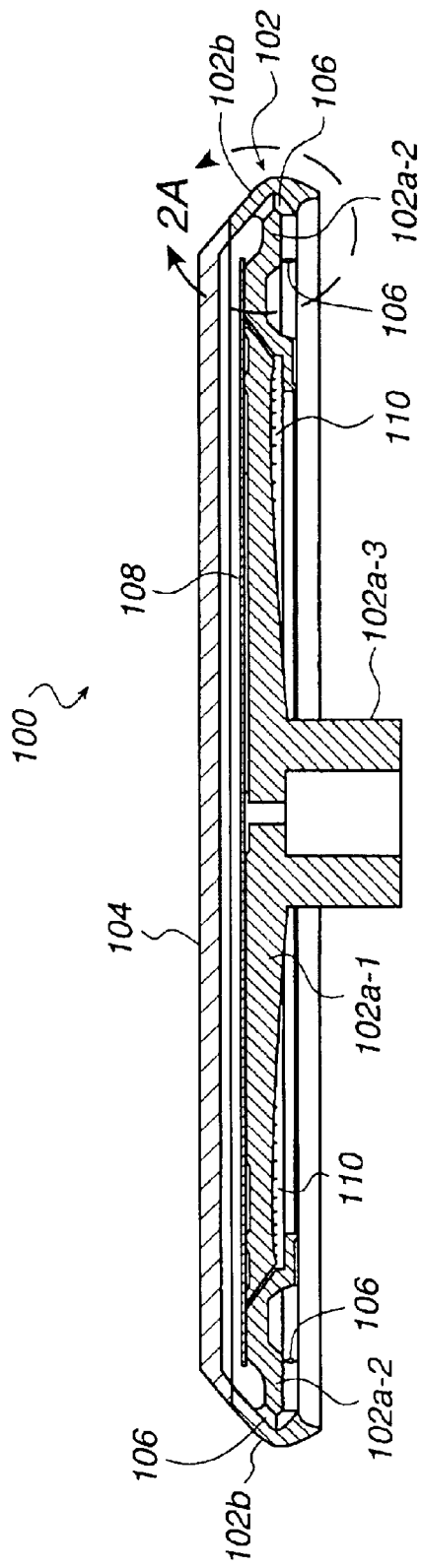
FIG. 1 is a cross-sectional view of an apparatus for spin coating a film over a substrate in accordance with one embodiment of the present invention.

FIG. 1 is a cross-sectional view of an apparatus for spin coating a film over a substrate in accordance with one embodiment of the present invention. As shown in FIG. 1, spin coating apparatus 100 includes spin bowl 102 and lid 104, which is secured to the spin bowl to define a closed chamber. Spin bowl 102 includes base 102a and inwardly curved sidewall 102b that extends upwardly from the base. Base 102a includes upper portion 102a-1 for supporting a substrate in a horizontal plane and lower portion 102a-2 in which a plurality of V-shaped drain holes 106 are formed. As shown in FIG. 1, semiconductor wafer 108 is supported on the upper surface of upper portion 102a-1. Wafer 108 may be secured to the upper surface of upper portion 102a-1 using known techniques, e.g., a vacuum. Base 102a also includes cylindrical portion 102a-3 that is configured to receive a rotatable drive shaft (not shown) for spinning spin bowl 102. As shown in FIG. 1, base 102a further includes cavity 110, which may be used to channel rinse solvents to the backside of wafer 108 in accordance with known techniques.

Those skilled in the art are familiar with suitable techniques for securing lid 104 to sidewall 102b so that the flat underside of the lid is in close proximity to the top surface of wafer 108. Those skilled in the art also are familiar with suitable techniques for connecting cylindrical portion 102a-3 of base 102a to a drive shaft and for rotating the drive shaft with a motor. Additional details regarding these techniques are described in U.S. Pat. Nos. 5,908,661 and 5,916,631, which are owned by the assignee of the subject application. The disclosures of the '661 and '631 patents are incorporated herein by reference.

Figure 2A:
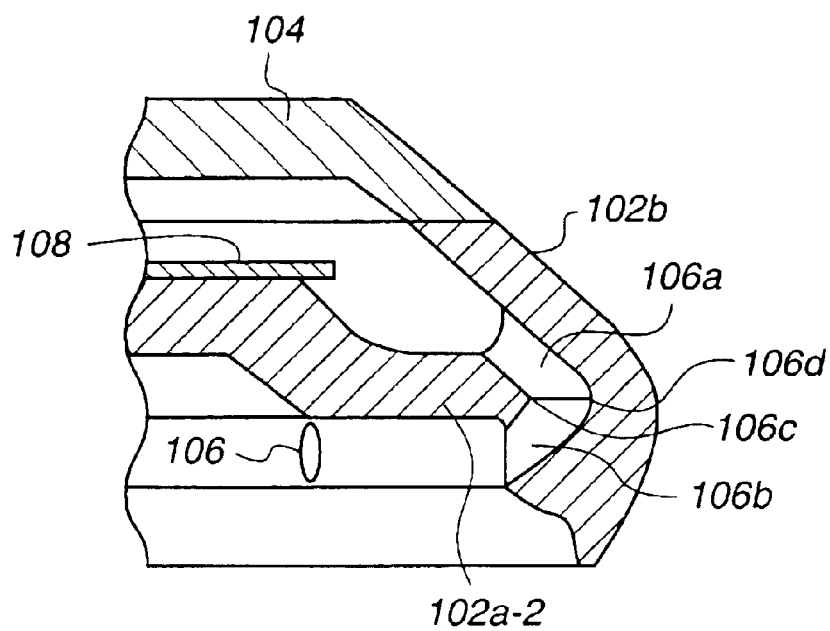
FIG. 2A is an enlarged view of region 2A shown in FIG. 1 that shows additional details of the V-shaped drain holes formed in the spin bowl.

FIG. 2A is an enlarged view of region 2A shown in FIG. 1 that shows additional details of the V-shaped drain holes.

Figure 2B:
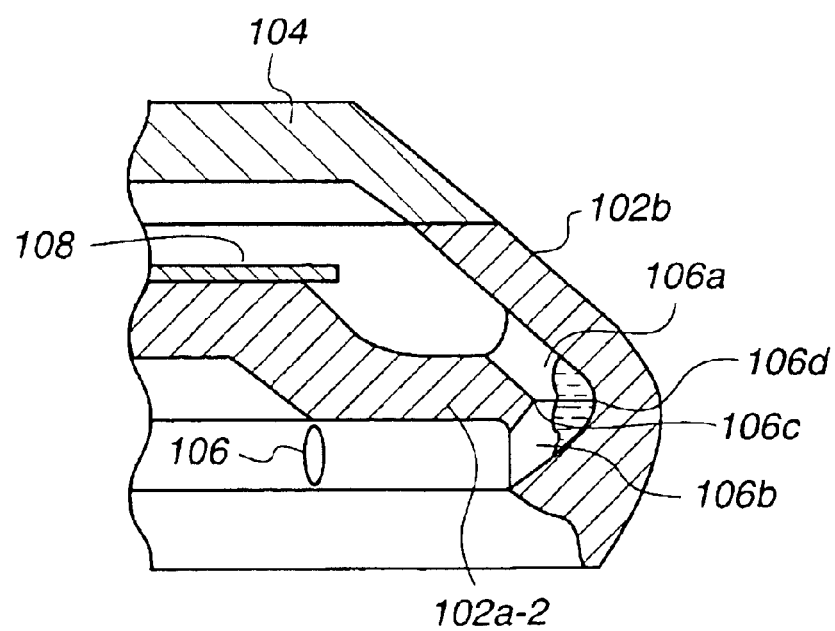

As shown in FIG. 2A, V-shaped drain hole 106 includes first leg 106a and second leg 106b. The intersection of legs 106a and 106b defines inner corner 106c and outer corner 106d. During a spin coating operation, excess fluid, e.g., solvent that is dispensed through the backside rinse channel (see cavity 110 in FIG. 1) and fluid that spins off the surface of wafer 108, drains from spin bowl 102 through drain hole 106 as shown in FIGS. 2B–2D. The centrifugal force generated by spinning spin bowl 102 forces the excess fluid toward the outer edge of the bowl. As shown in FIG. 2B, the excess fluid initially collects in outer corner 106d of drain hole 106. As the spin coating operation progresses, excess fluid continues to flow into drain hole 106. Eventually, as shown in FIG. 2C, the excess fluid accumulates to the point that inner corner 106c is immersed in the excess fluid. At this point, the excess fluid trapped in drain hole 106 forms a fluid seal that blocks air from flowing into the interior of spin bowl 102. Once drain hole 106 is completely filled with excess fluid, as shown in FIG. 2D, any additional excess fluid that enters first leg 106a will cause a corresponding amount of fluid to exit automatically out of lower leg 106b. When the spin coating operation is finished, spin bowl 102 decelerates until the bowl comes to rest. As spin bowl 102 decelerates, the centrifugal force generated by spinning the bowl recedes to zero and the fluid in drain hole 106 drains into a stationary drain bowl (see reference numeral 116 in FIG. 4A) situated below the spin bowl.

FIG. 3 is a simplified schematic diagram that illustrates exemplary drain hole locations in accordance with one embodiment of the invention. As shown in FIG. 3, sixteen drain hole locations 112 are substantially equally spaced around spin bowl 102. In one embodiment, drain holes 106 are formed at each of drain hole locations 112 shown in FIG. 3. In another embodiment, drain holes 106 are formed at every other hole location 112. It will be apparent to those skilled in the art that the number of drain holes 106 provided in spin bowl 102 may be varied to suit the needs of particular applications. The diameter of drain holes 106 is preferably in a range of from about 1 mm to about three sixteenths of an inch, depending on the thickness of the fluid being spin coated. For thinner fluids, drain holes having a diameter as small as about 1 mm may be appropriate. In this regard, those skilled in the art will recognize that the diameter of the drain holes must be large enough so that capillary action does not cut off the draining action. For thicker fluids, drain holes having a diameter as large as about three sixteenths of an inch may be appropriate. In one embodiment, drain holes 106 have a diameter of about one eighth of an inch.

FIG. 4A is a cross-sectional view of an apparatus for spin coating a film over a substrate in accordance with another embodiment of the present invention. As shown in FIG. 4A, spin coating apparatus 100' includes spin bowl 102' and lid 104, which is secured to the spin bowl to define a closed chamber. Spin bowl 102' is the same as spin bowl 102 described above with reference to FIG. 1, except for the inclusion of an external fluid catch area. As shown in FIG. 4A, inwardly curved sidewall 102b' extends downwardly from base 102a so as to define external fluid catch area 114. As used in connection with the description of the invention, the phrase "external fluid catch area" means a fluid catch area that is outside of an internal chamber in which a substrate is supported for a spin coating operation. External fluid catch area 114 is configured to retain excess fluid that drains from drain holes 106 while spin bowl 102' is spinning. This is advantageous because it prevents excess fluid from leaving spin bowl 102' and contacting sidewall 116a of a stationary drain bowl 116 at high velocity, which can cause undesirable splashing and atomization of the fluid outside the spin bowl.

Figure 4B:
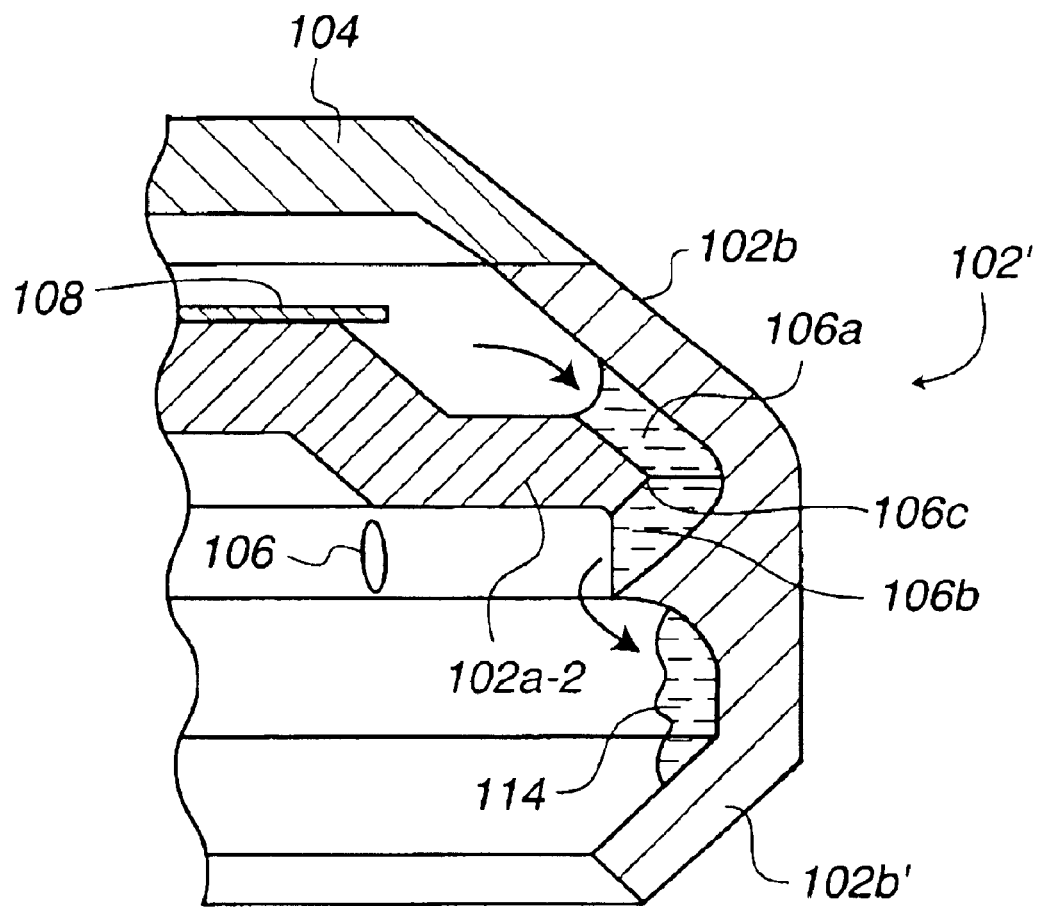
FIG. 4B is an enlarged view of region 4B shown in FIG. 4A that illustrates the manner in which excess fluid is retained in the drain hole and the external fluid catch area during a spin coating operation to form a fluid seal that prevents air from flowing into the spin bowl through the drain holes.

FIG. 4B is an enlarged view of region 4B shown in FIG. 4A that illustrates the manner in which excess fluid is retained in the drain hole and the external fluid catch area during a spin coating operation. As described above, the centrifugal force generated by spinning the spin bowl forces excess fluid to the outer edge of the bowl. As shown in FIG. 4B, excess fluid has accumulated to the point that drain hole 106 is filled and an amount of excess fluid has drained out of the drain hole and has been trapped in external fluid catch area 114. The inner surface of sidewall 102b' is contoured so that external fluid catch area 114 has a channel-like configuration that retains the excess fluid while spin bowl 102' is spinning. As described above, when the spin coating operation is finished, spin bowl 102' decelerates until the bowl comes to rest. As spin bowl 102' decelerates, the centrifugal force generated by spinning the bowl recedes to zero and the fluid in drain hole 106 and external fluid catch area 114 drains into stationary drain bowl 116 (see FIG. 4A) situated below the spin bowl. Because the fluid drains into the stationary drain bowl while the spin bowl is spinning relatively slowly or is at rest, the fluid contacts the sidewall at a relatively low velocity that minimizes splashing and atomization of the fluid outside the bowl.

External fluid catch area 114 is preferably configured to retain at least the amount of excess fluid that is generated in a typical spin coating operation. In one embodiment designed for spin coating 300 mm wafers, external fluid catch area 114 is capable of retaining at least about 2 cc of excess fluid during a spin coating operation. As shown in FIG. 4B, external fluid catch area 114 has a channel-like configuration in part because sidewall 102b' curves inwardly toward a center of spin bowl 102'. It will be apparent to those skilled in the art, however, that an external fluid catch area could be formed in a straight sidewall by forming a channel in the inner surface of the straight sidewall.

As shown in FIGS. 1 through 4B, a fluid seal is formed by trapping fluid in a V-shaped drain hole during spinning of the spin bowl. Those skilled in the art will recognize that drain holes having other suitable shapes, e.g., a U-shape, also may be used to form a fluid seal in accordance with the present invention. In addition, those skilled in the art will recognize that a fluid seal also may be formed in spin bowls having straight drain holes. By way of example, a fluid seal may be formed by the intersection of a straight drain hole and a suitably configured channel, with the channel being defined either inside or outside the spin bowl.

Figure 5A:
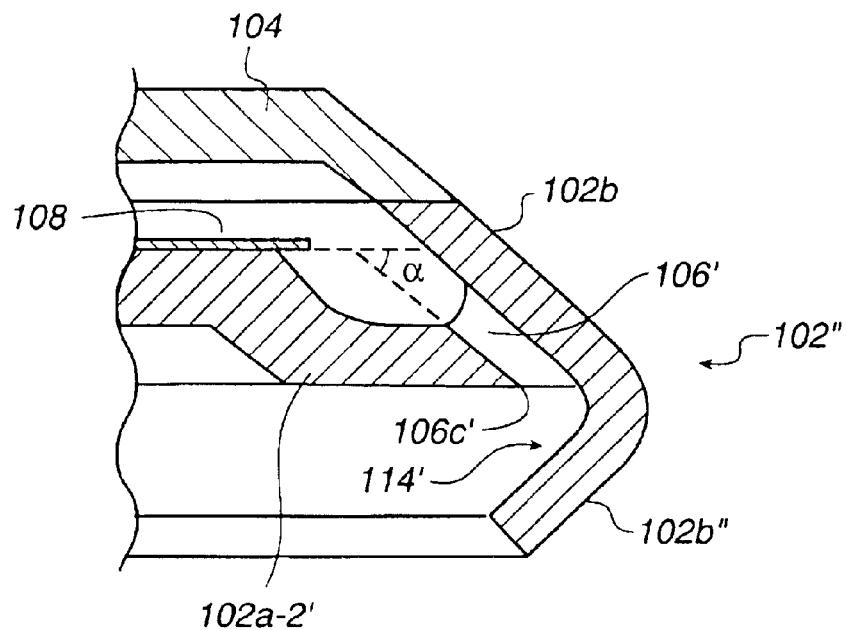
FIG. 5A is a cross-sectional view that illustrates an alternative embodiment of the present invention in which the intersection of a straight drain hole and a channel is used to form a fluid seal that prevents air from flowing into the spin bowl through the drain holes.

FIG. 5A illustrates an alternative embodiment of the present invention in which the intersection of a straight drain hole and a channel is used to form a fluid seal. As shown in FIG. 5A, spin bowl 102' includes drain hole 106', which has a configuration that substantially corresponds to that of first leg 106a of V-shaped drain hole 106 shown in, for example, FIGS. 1 and 2A–2D. Drain hole 106' is angled so that the inlet at the interior of the spin bowl is closer to the center of the bowl than the outlet at the exterior of the bowl. In one embodiment, drain hole 106' is oriented at an angle, α, of about 30 degrees to about 60 degrees relative to the horizontal plane defined by the upper portion of the base. In a preferred embodiment, drain hole 106' is oriented at an angle, α, of about 45 degrees. Drain hole 106' is in fluid communication with external fluid catch area 114', which has a channel-like configuration defined in part by the inner surface of sidewall 102b". The intersection of drain hole 106' and external fluid catch area 114' defines inner corner 106c'. Sidewall 102b" is inclined inwardly so that the tip thereof is situated closed to the center of the spin bowl than the point at which sidewall 102b" intersects with sidewall 102b.

Figure 5B:
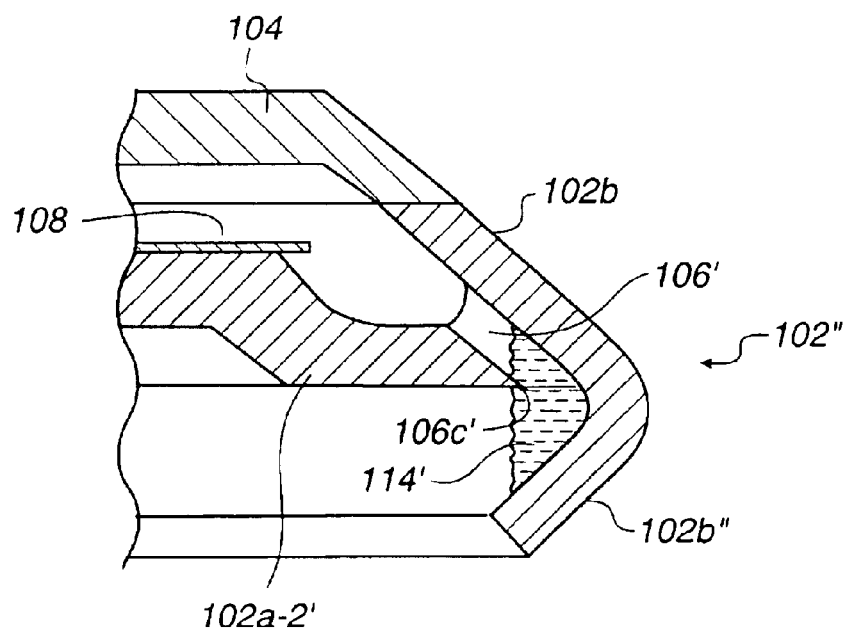
FIG. 5B illustrates the manner in which excess fluid is retained in the drain hole and the external fluid catch area shown in FIG. 5A during a spin coating operation.

FIG. 5B illustrates the manner in which excess fluid is retained in drain hole 106' and external fluid catch area 114' shown in FIG. 5A during a spin coating operation. As described above, the centrifugal force generated by spinning the spin bowl forces excess fluid to the outer edge of the bowl. As shown in FIG. 5B, excess fluid has accumulated in drain hole 106' and external fluid catch area 114' at the outer edge of spin bowl 102" to the point that inner corner 106c' is immersed in the excess fluid. Once the excess fluid covers inner corner 106c', the excess fluid completely blocks the outlet of drain hole 106' and thus forms a fluid seal that prevents air from flowing into the interior of spin bowl 102". It will be apparent to those skilled in the art that, if desired, the configuration of spin bowl 102" may be modified so that the fluid catch area is formed in the interior of the spin bowl. In this case, the accumulation of excess fluid in the internal fluid catch area will eventually completely block the inlet of drain hole 106' and thereby form a fluid seal that prevents air from flowing into the interior of spin bowl 102". In the event an internal fluid catch area is used, it should be borne in mind that the drawbacks of retaining the excess fluid inside the bowl set forth in the "Background of the Invention" section will come into play.

FIG. 6 is a flowchart diagram 200 illustrating the method operations performed in spin coating a substrate in accordance with one embodiment of the invention. The method begins in operation 202 in which a substrate is disposed in a spin bowl. The substrate may be any substrate over which a film is to be spin coated, e.g., a semiconductor wafer or a compact disc. Those skilled in the art are familiar with suitable techniques for securing the substrate in the spin bowl. In operation 204, the spin bowl is spun at a relatively low speed. The spin bowl may be spun by mounting the bowl on a motor-driven shaft, as is well known to those skilled in the art. By way of example, in the case of a spin bowl designed to accommodate a 300 mm wafer, the spin bowl may be spun at a relatively low speed of about 300 RPM. Next, in operation 206, a first fluid is injected into the spin bowl. The first fluid is preferably injected toward the outer edge of the spin bowl. The first fluid may be a solvent or any other fluid suitable for forming a fluid seal. In one embodiment, the first fluid is a rinse solvent that is injected toward the outer edge of the spin bowl through a backside rinse channel, e.g., cavity 110 shown in FIG. 1. The rinse solvent may be any suitable solvent that is compatible with the material that is being spin coated over the surface of the substrate.

As the spin bowl is spinning at the relatively low speed, the method proceeds to operation 208 in which in which excess fluid is captured at an outer edge of the spin bowl to form a fluid seal that prevents air from flowing into the bowl through the drain holes formed therein. In one embodiment, the fluid seal is formed by capturing excess fluid in a V-shaped drain hole as described above with reference to FIGS. 1 and 2A–2D. In another embodiment, the fluid seal is formed by capturing excess fluid in an external fluid catch area so that the excess fluid blocks the outlet of a straight drain hole as described above with reference to FIGS. 5A and 5B. In yet another embodiment, the fluid seal may be formed by capturing excess fluid in an internal fluid catch area so that the excess fluid blocks the inlet of a straight drain hole. Once the fluid seal is formed, the method proceeds to operation 210 in which a second fluid is applied to the surface of the spinning substrate. The second fluid may be applied in the form of one or more beads using standard fluid dispensing techniques. The second fluid may be a photoresist material, a low k dielectric material, a spin-on-glass (SOG), a dye chemical used in the fabrication of recordable compact discs (CD-Rs and CD-RWs), or any other fluid suitable for spin coating a film over a substrate.

Next, in operation 212, a lid is secured to the spin bowl so that the substrate is enclosed within a chamber. The lid may be secured to the spin bowl using conventional techniques. As is well known to those skilled in the art, the lid seals the chamber in which the substrate is disposed from the environment and thereby helps reduce particulate contamination and increase control of the airflow above the substrate. It will be apparent to those skilled in the art that operation 212 may be omitted for spin coating operations that may be conducted in an open bowl, i.e., without a lid. In operation 214, the spin bowl is spun at a relatively high speed to spread the fluid over the surface of the substrate. By way of example, in the case of a spin bowl designed to accommodate a 300 mm wafer, the spin bowl may be spun at a relatively high speed of about 5,000 RPM. The fluid seal created at low speed ensures that the spin bowl is sealed throughout the entire high-speed operation in which the film is formed over the surface of the substrate. This prevents the onset of turbulence caused by open drain holes during the formation of the film and thereby avoids the adverse effects that such turbulence may have on the characteristics of the film.

Once the fluid is spread over the surface of the substrate to form a film, the method proceeds to operation 216 in which the spin bowl is brought to rest. The spin bowl may be decelerated at any desired rate using known techniques. As the spin bowl decelerates, the centrifugal force generated by spinning the bowl recedes to zero and allows the fluid captured in the drain holes and any fluid remaining in the spin bowl to drain into a stationary drain bowl situated below the spin bowl. Once this fluid is drained into the drain bowl, the method is done.

The fluid-sealed spin bowl of the present invention provides a number of significant advantages relative to conventional spin bowls. These advantages include the elimination of streaks caused by the back flow of air into the bowl, improved coat uniformity at all thicknesses, and greater process latitude in the formation of spun films. The primary reason that the fluid-sealed spin bowl affords greater process latitude is that the film can be spun for a longer period of time without drying because of the completely enclosed and sealed environment within the bowl. In the embodiments in which the excess fluid is trapped in an external fluid catch area, the fluid-sealed spin bowl of the present invention is further advantageous because the use of an external fluid catch area prevents the trapped fluid from splashing onto the wafer, and because its one-piece construction avoids the need for an extra baffle piece as found in one known spin bowl design. An additional advantage of the external fluid catch area is that it prevents the fluid that drains from the spin bowl during spinning from leaving the sidewall and contacting the sidewall of a stationary drain bowl at high velocity. This reduces splashing and atomization of the fluid outside the bowl.

In summary, the present invention provides a fluid-sealed spin bowl, a spin bowl having an external fluid catch area, an apparatus for spin coating a film over a substrate, and a method for spin coating a film over a substrate. The invention has been described herein in terms of several exemplary embodiments. Other embodiments of the invention will be apparent to those skilled in the art from consideration of the specification and practice of the invention. For example, as described above, a fluid seal may be formed in drain holes having shapes other than a V-shape, e.g., a U-shape or other suitable shape in which fluid may be trapped. In addition, as also described above, the spin bowl may be configured to define a fluid catch area that traps excess fluid while the bowl is spinning so that the excess fluid blocks either the inlets or the outlets of straight drain holes. The embodiments and preferred features described above should be considered exemplary, with the scope of the invention being defined by the appended claims and their equivalents.

What is claimed is:

1. A spin bowl, comprising:
a base and a sidewall that extends from the base, the base having an upper portion for supporting a substrate in a horizontal plane and a lower portion that intersects with the sidewall, the lower portion of the base having a plurality of drain holes formed therein proximate to the sidewall, each of the plurality of drain holes being V-shaped or U-shaped to trap fluid therein during spinning of the spin bowl to thereby form a fluid seal that prevents air from flowing therethrough.

2. The spin bowl of claim 1, wherein each of the plurality of drain holes is V-shaped.

3. The spin bowl of claim 2, wherein each of the plurality of V-shaped drain holes has a leg that is oriented at an angle in a range from 30 degrees to 60 degrees relative to the horizontal plane defined by the upper portion of the base.

4. The spin bowl of claim 3, wherein each of the plurality of V-shaped drain holes has a leg that is oriented at an angle of 45 degrees relative to the horizontal plane defined by the upper portion of the base.

5. An apparatus for spin coating a film over a substrate, comprising:
a rotatable spin bowl, the rotatable spin bowl having a base and a sidewall that extends from the base, the base having an upper portion for supporting a substrate in a horizontal plane and a lower portion that intersects with the sidewall, the lower portion of the base having a plurality of drain holes formed therein proximate to the sidewall, each of the plurality of drain holes being V-shaped or U-shaped to trap fluid therein during spinning of the spin bowl to thereby form a fluid seal that prevents air from flowing therethrough; and
a lid secured to the rotatable spin bowl so as to define a closed chamber, the lid being configured to mate with the sidewall of the rotatable spin bowl so that an underside of the lid is in close proximity to a top surface of the substrate supported on the upper portion of the base.

6. The apparatus of claim 5, wherein each of the plurality of drain holes is V-shaped.

7. The apparatus of claim 6, wherein each of the plurality of V-shaped drain holes has a leg that is oriented at an angle in a range from 30 degrees to 60 degrees relative to the horizontal plane defined by the upper portion of the base.

8. The apparatus of claim 7, wherein each of the plurality of V-shaped drain holes has a leg that is oriented at an angle of 45 degrees relative to the horizontal plane defined by the upper portion of the base.

9. A spin bowl, comprising:
a base and a sidewall that extends from the base, the base having an upper portion for supporting a substrate in a horizontal plane and a lower portion that intersects with the sidewall, the lower portion of the base having a plurality of drain holes formed therein proximate to the sidewall, each of the drain holes being oriented at an angle in a range of 30 degrees to 60 degrees relative to the horizontal plane defined by the upper portion of the base, the sidewall having an upper portion that extends upwardly from the base and a lower portion that extends downwardly from the base so as to at least partially define an external fluid catch area that receives excess fluid that drains from an interior of the spin bowl through the drain holes, the external fluid catch area being configured to retain the excess fluid while the spin bowl is spinning and thereby prevent the excess fluid from leaving the spin bowl at high velocity, and wherein each of the drain holes and an inner surface of the lower portion of the sidewall are oriented so as to define a V-shape such that the excess fluid retained in the external fluid catch area while the spin bowl is spinning forms a fluid seal that prevents air from flowing through the drain holes.

10. The spin bowl of claim 9, wherein the lower portion of the sidewall is inclined inwardly so that a tip thereof is situated closer to a center of the spin bowl than a point at which the lower portion of the sidewall intersects with the upper portion of the sidewall.

11. The spin bowl of claim 9, wherein each of the drain holes has an inlet at an interior of the spin bowl and an outlet at an exterior of the spin bowl, and each of the drain holes is oriented so that the inlet is closer to a center of the spin bowl than the outlet.

12. The spin bowl of claim 9, wherein each of the drain holes is oriented at an angle of 45 degrees relative to the horizontal plane defined by the upper portion of the base.

13. A spin bowl, comprising:
a base and a sidewall that extends from the base, the base having an upper portion for supporting a substrate in a horizontal plane and a lower portion that intersects with the sidewall, the lower portion of the base having a plurality of V-shaped drain holes formed therein proximate to the sidewall, and each of the plurality of V-shaped drain holes has a leg that is oriented at an angle in a range of 30 degrees to 60 degrees relative to the horizontal plane defined by the upper portion of the base.

14. The spin bowl of claim 13, wherein each of the plurality of V-shaped drain holes has a leg that is oriented at an angle of 45 degrees relative to the horizontal plane defined by the upper portion of the base.

* * * * *